US011710580B2

(12) United States Patent
Jiu et al.

(10) Patent No.: US 11,710,580 B2
(45) Date of Patent: Jul. 25, 2023

(54) ELECTRICALLY CONDUCTIVE PASTE AND SINTERED BODY

(71) Applicant: SENJU METAL INDUSTRY CO., LTD., Tokyo (JP)

(72) Inventors: Jinting Jiu, Tokyo (JP); Tetsu Takemasa, Tokyo (JP); Junko Seino, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 17/258,271

(22) PCT Filed: Mar. 20, 2019

(86) PCT No.: PCT/JP2019/011634
§ 371 (c)(1),
(2) Date: Jan. 6, 2021

(87) PCT Pub. No.: WO2020/008689
PCT Pub. Date: Jan. 9, 2020

(65) Prior Publication Data
US 2021/0245242 A1    Aug. 12, 2021

(30) Foreign Application Priority Data
Jul. 6, 2018    (JP) .................................. 2018-129163

(51) Int. Cl.
*H01B 1/02*    (2006.01)
*H01B 1/22*    (2006.01)
(Continued)

(52) U.S. Cl.
CPC ............... *H01B 1/02* (2013.01); *B22F 1/052* (2022.01); *B22F 1/107* (2022.01); *H01B 1/22* (2013.01);
(Continued)

(58) Field of Classification Search
None
See application file for complete search history.

(56) References Cited

U.S. PATENT DOCUMENTS

2009/0236404 A1    9/2009  Yamakawa et al.

FOREIGN PATENT DOCUMENTS

| CN | 106847368 A | 6/2017 |
|---|---|---|
| EP | 2455947 A1 | 5/2012 |

(Continued)

OTHER PUBLICATIONS

Decision to Grant a Patent issued in JP-2020-528691, (in Japanese with English Translation), dated Jul. 27, 2020 (which granted as JP-6756085-B2 and is based on PCT/JP2019/011634 and claims priority to JP-2018-129163).
(Continued)

*Primary Examiner* — Alicia Chevalier
*Assistant Examiner* — Elaine M Vazquez
(74) *Attorney, Agent, or Firm* — Harness, Dickey & Pierce, P.L.C.

(57) ABSTRACT

An object of the present invention is to provide an electrically conductive paste and a sintered body thereof having a low electric resistance value and excellent electrical conductivity when made into a sintered body.
An electrically conductive paste comprising: a flake-like silver powder having a median diameter D50 of 15 μm or less; a silver powder having a median diameter D50 of 25 μm or more; and a solvent,
wherein the content of the flake-like silver powder is 15 to 70 parts by mass and the content of the silver powder having a median diameter D50 of 25 μm or more is 30 to 85 parts by mass based on 100 parts by mass in total of the flake-like silver powder and the silver powder having a median diameter D50 of 25 μm or more.

20 Claims, 10 Drawing Sheets

Sintered Ag
(3 mm × 30 mm)

Glass substrate

(51) Int. Cl.
*H05K 1/09* (2006.01)
*B22F 1/052* (2022.01)
*B22F 1/107* (2022.01)
*B22F 1/068* (2022.01)
*B22F 1/065* (2022.01)
*B22F 1/10* (2022.01)

(52) U.S. Cl.
CPC .............. *H05K 1/092* (2013.01); *B22F 1/065* (2022.01); *B22F 1/068* (2022.01); *B22F 1/10* (2022.01); *B22F 2301/255* (2013.01)

(56) References Cited

FOREIGN PATENT DOCUMENTS

| | | |
|---|---|---|
| JP | H05-81923 A | 4/1993 |
| JP | 2004-362950 A | 12/2004 |
| JP | 2006-66235 A | 3/2006 |
| JP | 2009-170277 A | 1/2009 |
| JP | 2011-071057 A | 4/2011 |
| JP | 2012-028250 A | 2/2012 |
| WO | WO-2007-034833 A1 | 3/2007 |
| WO | WO-2012/031078 A1 | 3/2012 |
| WO | WO-2016/007351 A1 | 1/2016 |
| WO | WO-2017091782 A1 | 6/2017 |

OTHER PUBLICATIONS

International Search Report Issued in PCT/JP2019/011634 (in English and Japanese), dated May 28, 2019; ISA/JP.

Decision to Grant a Patent issued in JP-2020-52869, (in Japanese with English Translation), dated Jul. 27, 2020 (which granted as JP-6756085-B2 and is based on PCT/JP2019/011634 and claims priority to JP-2018-129163).

Extended European Search Report dated Jul. 14, 2021 in corresponding European Patent Application No. 19830980.9.

US 11,710,580 B2

ELECTRICALLY CONDUCTIVE PASTE AND SINTERED BODY

CROSS REFERENCE TO RELATED APPLICATIONS

This application is a U.S. National Phase Application under 35 U.S.C. 371 of International Application No. PCT/JP2019/011634 filed on Mar. 20, 2019, which claims the benefit of priority from Japanese Patent Application No. 2018-129163 filed on Jul. 6, 2018. The entire disclosures of all of the above applications are incorporated herein by reference.

TECHNICAL FIELD

The present invention relates to an electrically conductive paste and a sintered body.

BACKGROUND ART

Conventionally, an electrically conductive paste using a metal powder of μm size (hereinafter sometimes referred to as "micron size") or nm size (hereinafter sometimes referred to as "nano size") has been widely used as an electrically conductive material. The electrically conductive paste using such micron-sized or nano-sized metal powder is used, for example, for forming an electronic circuit such as an electrode or wiring in a printed wiring board, or for bonding between an electronic substrate and an electronic component.

In Patent Literature 1, as an electrically conductive paste using such metal powder, a paste-like silver particle composition, which is a paste-like material composed of non-spherical silver particles having an average particle size of 0.1 to 18 μm and a carbon content of 1.0% by weight or less and a volatile dispersant, and characterized in that the volatile dispersant is volatilized upon heating and the non-spherical silver particles sinter with each other, is proposed. Patent Literature 1 specifically discloses an electrically conductive paste using flake-like silver particles as the above non-spherical silver particles. However, as described later in Comparative Example 2 of the present application, an electrically conductive paste using only silver particles (silver powder) having a small average particle diameter of 18 μm or less, as described in Patent Literature 1, has a high electric resistance value and insufficient electrical conductivity when sintered and made into a wiring.

In Patent Literature 2, an electrically conductive paste comprising silver particles having an average particle diameter (median diameter) of 0.1 μm to 15 μm and an alcohol is proposed. Patent Literature 2 specifically discloses an electrically conductive paste in which as the above silver particles, two kinds of silver particles, namely, silver particles having an average particle diameter (median diameter) of 0.3 μm and silver particles having an average particle diameter (median diameter) of 2.0 to 3.2 μm, are mixed. However, as described later in Comparative Examples 3 and 4 of the present application, an electrically conductive paste obtained by mixing only two types of silver particles (silver powder) having a small average particle size of 15 μm or less, as described in Patent Literature 2, has a high electric resistance value and insufficient electrical conductivity when sintered and made into a wiring.

In the Patent Literature 3, a method for making an electrical conductor paste mainly composed of silver powder is proposed, which includes a step of preparing an electrically conductive powder formed by mixing at least two types of spherical silver powders having mutually different average particle diameters with at least two types of flake-like silver powders having mutually different average particle diameters, and a step of dispersing the electrically conductive powder in an organic medium. In Patent Literature 3, it is also disclosed to use a combination of a spherical silver powder having an average particle diameter of 0.1 to 0.8 μm and a spherical silver powder having an average particle diameter of 1.0 to 2.0 μm as at least two types of spherical silver powder described above, and a flake-like silver powder having an average particle size of 1 to 4 μm and a flake-like silver powder having an average particle size of 5 to 15 μm as at least two types of flake-like silver powder described above. However, each of the four types of silver powder described in Patent Literature 3 has a small average particle size of 15 μm or less. As will be described later in Comparative Examples 11 to 13 of the present application, an electrically conductive paste containing no silver powder having a median diameter of 25 μm or more as described in Patent Literature 3 does not have sufficient bonding strength when an electronic substrate and an electronic component are bonded together.

In Patent Literature 4, an electrically conductive adhesive characterized in that an amount of bulky silver powder filled having an average particle diameter of 45 μm to 1000 μm and an apparent density of 0.01 g/cm$^3$ to 0.1 g/cm$^3$, including wrinkled silver powder, and obtained by crushing a silver foil is 5% by weight or more and less than 25% by weight and the amount of an adhesive filled is more than 75% by weight and 95% by weight or less is proposed. However, the electrically conductive adhesive described in Patent Literature 4 is based on the premise that it contains a polymer compound, and is a material different from the electrically conductive paste in which only silver powder is mixed with a solvent.

CITATION LIST

Patent Literature

PTL 1: International Publication No. WO 2007/034833
PTL 2: Japanese Patent Laid-Open No. 2009-170277
PTL 3: Japanese Patent Laid-Open No. 2004-362950
PTL 4: Japanese Patent Laid-Open No. H05-81923

The conventional electrically conductive paste has a problem that it has a high electric resistance value and insufficient electrical conductivity when applied to a printed wiring board and then sintered to form a wiring, and insufficient bonding strength when an electronic substrate and an electronic component are bonded.

Therefore, it is desirable to have an electrically conductive paste with a low electric resistance value and excellent electrical conductivity when made into a sintered body. It is also desirable to have an electrically conductive paste with excellent bonding strength in addition to excellent electrical conductivity when electronic substrates and the like are bonded.

SUMMARY OF INVENTION

Technical Problem

An object of the present invention is to provide an electrically conductive paste having a low electric resistance value and excellent electrical conductivity when made into a sintered body, and a sintered body thereof. Another object of the present invention is to provide an electrically conductive paste which has excellent bonding strength when electronic substrates and the like are bonded, in addition to excellent electrical conductivity, and a sintered body thereof.

Solution to Problem

As a result of intensive studies to solve the above problems, the inventors have found that the above problems can be solved by using a combination of a specific amount of a flake-like silver powder having a median diameter D50 of 15 μm or less, a specific amount of a silver powder having a median diameter D50 of 25 μm or more, and a solvent, and the present invention has been completed. Specific embodiments of the present invention are as follows.

Note that in the present specification, when a numerical range is represented by using "to", the range includes numerical values at both ends.

[1] An electrically conductive paste comprising: a flake-like silver powder having a median diameter D50 of 15 μm or less; a silver powder having a median diameter D50 of 25 μm or more; and a solvent,
wherein the content of the flake-like silver powder is 15 to 70 parts by mass and the content of the silver powder having a median diameter D50 of 25 μm or more is 30 to 85 parts by mass based on 100 parts by mass in total of the flake-like silver powder and the silver powder having a median diameter D50 of 25 μm or more.

[2] An electrically conductive paste comprising: a flake-like silver powder having a median diameter D50 of 15 μm or less; a silver powder having a median diameter D50 of 25 μm or more; a silver powder having a bimodal particle size distribution with peaks at 0.1 μm to 0.5 μm and 1 μm to 15 μm; and a solvent,
wherein the content of the flake-like silver powder is 8 to 55 parts by mass, the content of the silver powder having a median diameter D50 of 25 μm or more is 15 to 65 parts by mass, and the content of the silver powder having a bimodal particle size distribution is 4 to 45 parts by mass based on 100 parts by mass in total of the flake-like silver powder, the silver powder having a median diameter D50 of 25 μm or more, and the silver powder having a bimodal particle size distribution.

[3] The electrically conductive paste according to [1], wherein the content of the flake-like silver powder is 30 to 42 parts by mass and the content of the silver powder having a median diameter D50 of 25 μm or more is 58 to 70 parts by mass based on 100 parts by mass in total of the flake-like silver powder and the silver powder having a median diameter D50 of 25 μm or more.

[4] The electrically conductive paste according to [2], wherein the content of the flake-like silver powder is 23 to 35 parts by mass, the content of the silver powder having a median diameter D50 of 25 μm or more is 40 to 63 parts by mass, and the content of the silver powder having a bimodal particle size distribution is 12 to 35 parts by mass based on 100 parts by mass in total of the flake-like silver powder, the silver powder having a median diameter D50 of 25 μm or more, and the silver powder having a bimodal particle size distribution.

[5] A sintered body obtained by sintering the electrically conductive paste according to any one of [1] to [4].

[6] A sintered body obtained by sintering a laminated body comprising a substrate, the electrically conductive paste according to any one of [1] to [4], and an electrical conductor.

Advantageous Effects of Invention

The electrically conductive paste and the sintered body thereof of the present invention have a low electric resistance value and excellent electrical conductivity when made into a sintered body.

In addition, the electrically conductive paste and the sintered body of the present invention have excellent bonding strength when electronic substrates and the like are bonded, in addition to excellent electrical conductivity.

DESCRIPTION OF EMBODIMENTS

Figure 1:
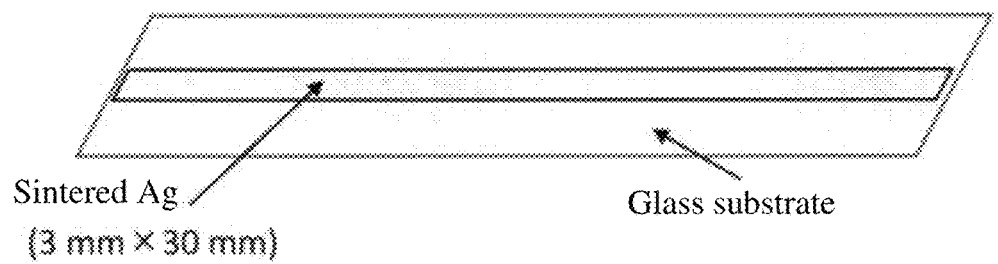
FIG. 1 is a schematic diagram of the wiring used for evaluation of the electric resistance value in Examples.

Hereinafter, the electrically conductive paste and the sintered body of the present invention will be described.

First Embodiment

An electrically conductive paste of the present invention comprises a flake-like silver powder having a median diameter D50 of 15 μm or less, a silver powder having a median diameter D50 of 25 μm or more, and a solvent, and the content of the flake-like silver powder is 15 to 70 parts by mass and the content of the silver powder having a median diameter D50 of 25 μm or more is 30 to 85 parts by mass based on 100 parts by mass in total of the flake-like silver powder and the silver powder having a median diameter D50 of 25 μm or more.

The median diameter D50 of the flake-like silver powder is 15 μm or less, preferably 0.1 μm to 15 μm, and more preferably 2 μm to 10 μm. When the median diameter D50 of the flake-like silver powder is within the above numerical range, the surface area is increased as compared with the case where the spherical powder is used, thus a sintered body is easily formed.

In the present invention, the median diameter D50 of each silver powder means that measured by a laser diffraction method using SALD-2300 (manufactured by Shimadzu Corporation).

In the present invention, the flake-like silver powder may be any as long as a majority of particles constituting the silver powder are recognized as flake-like (flake-shaped or flaky) under a microscope. Typically, it means that 51% by mass or more of the particles (primary particles) constituting the silver powder have a flake (flake or flaky) shape. Here, the flake-like (flake-shaped or flaky) particles mean particles having an aspect ratio (ratio of longest long diameter/ shortest short diameter) of 5 to 300.

The silver powder having a median diameter D50 of 25 μm or more has a median diameter D50 of 25 μm or more, preferably 25 μm to 100 μm, and more preferably 30 μm to 80 μm.

If only a particle having a particle size of less than 25 μm is used, the current will flow through each particle, thus the number of contact points of the particles will increase and the overall resistivity will increase. On the other hand, when the median diameter of the silver powder having the median diameter D50 of 25 μm or more is within the above numerical range, one particle contains a large particle, thus the number of contact points of the particles can be reduced and the overall resistivity becomes low. Therefore, it is possible to obtain an electrically conductive paste having a lower electric resistance value and excellent electrical conductivity when it is made into a sintered body as compared with the case where only a particle having a particle size of less than 25 μm is used.

The shape of the silver powder having a median diameter D50 of 25 μm or more is not particularly limited, and may be either spherical or non-spherical. Examples of the non-spherical shapes include flake-like, needle-like, horn-like, dendritic, granular, irregular-shaped, teardrop-like, plate-like, very thin plate-like, hexagonal plate-like, column-like, rod-like, porous, fibrous, lump-like, sponge-like, angular, and round shapes. Among these shapes, a spherical shape and a column-like shape are preferable.

The content of the flake-like silver powder is 15 to 70 parts by mass, preferably 30 to 60 parts by mass, and more preferably 30 to 50 parts by mass based on 100 parts by mass in total of the flake-like silver powder and the silver powder having a median diameter D50 of 25 μm or more.

The content of the silver powder having a median diameter D50 of 25 μm or more is 30 to 85 parts by mass, preferably 40 to 70 parts by mass, and more preferably 50 to 70 parts by mass based on 100 parts by mass in total of the flake-like silver powder and the silver powder having a median diameter D50 of 25 μm or more.

When both the content of the flake-like silver powder and the content of the silver powder having a median diameter D50 of 25 μm or more are within the above numerical ranges, an electrically conductive paste having a low electric resistance value and excellent electrical conductivity when made into a sintered body as well as an excellent bonding strength when electronic substrates and the like are bonded can be obtained.

The content of the flake-like silver powder based on 100 parts by mass of the electrically conductive paste is preferably 10 to 50 parts by mass, more preferably 20 to 50 parts by mass, and most preferably 30 to 50 parts by mass.

If the content of the flake-like silver powder is less than 10 parts by mass based on 100 parts by mass of the electrically conductive paste, it is difficult to make the composition containing the flake-like silver powder into a paste. Even if it is possible to make a composition containing the flake-like silver powder into a paste, a sintered body obtained from such an electrically conductive paste has a high electric resistance value and is inferior in electrical conductivity.

The content of the silver powder having a median diameter D50 of 25 μm or more based on 100 parts by mass of the electrically conductive paste is preferably 15 to 60 parts by mass, more preferably 20 to 55 parts by mass, and most preferably 30 to 55 parts by mass. When the content of the silver powder having a median diameter D50 of 25 μm or more is within the above numerical range, an electrically conductive paste having a low electric resistance value and excellent electrical conductivity when made into a sintered body as well as an excellent bonding strength when electronic substrates and the like are bonded can be obtained.

Examples of the solvent include water, an alcohol-type solvent, a glycol ether-type solvent, and terpineols.

Examples of the alcohol-type solvent include isopropyl alcohol, 1,2-butanediol, isobornylcyclohexanol, 2,4-diethyl-1,5-pentanediol, 2,2-dimethyl-1,3-propanediol, 2,5-dimethyl-2,5-hexanediol, 2,5-dimethyl-3-hexyne-2,5-diol, 2,3-dimethyl-2,3-butanediol, 1,1,1-tris(hydroxymethyl)ethane, 2-ethyl-2-hydroxymethyl-1,3-propanediol, 2,2'-oxybis(methylene)bis(2-ethyl-1,3-propanediol), 2,2-bis(hydroxymethyl)-1,3-propanediol, 1,2,6-trihydroxyhexane, bis[2,2,2-tris(hydroxymethyl)ethyl]ether, 1-ethynyl-1-cyclohexanol, 1,4-cyclohexanediol, 1,4-cyclohexanedimethanol, erythritol, threitol, guaiacol glycerol ether, 3,6-dimethyl-4-octyne-3,6-diol, and 2,4,7,9-tetramethyl-5-decyne-4,7-diol.

Examples of the glycol ether-type solvent include diethylene glycol mono-2-ethylhexyl ether, ethylene glycol monophenyl ether, 2-methylpentane-2,4-diol, diethylene glycol monohexyl ether, diethylene glycol dibutyl ether, and triethylene glycol monobutyl ether.

The content of the solvent based on 100 parts by mass of the electrically conductive paste is preferably 2 to 20 parts by mass, more preferably 2 to 15 parts by mass, and most preferably 5 to 10 parts by mass. When the content of the solvent is within the above numerical range, a paste having good coating property can be obtained.

Second Embodiment

The electrically conductive paste of the present invention comprises a flake-like silver powder having a median diameter D50 of 15 µm or less, a silver powder having a median diameter D50 of 25 µm or more, a silver powder having a bimodal particle size distribution with peaks at 0.1 µm to 0.5 µm and 1 µm to 15 µm, and a solvent, and the content of the flake-like silver powder is 8 to 55 parts by mass, the content of the silver powder having a median diameter D50 of 25 µm or more is 15 to 65 parts by mass, and the content of the silver powder having a bimodal particle size distribution is 4 to 45 parts by mass based on 100 parts by mass in total of the flake-like silver powder, the silver powder having a median diameter D50 of 25 µm or more, and the silver powder having a bimodal particle size distribution.

Regarding a median diameter D50 of the flake-like silver powder, a definition of flake shape, the content of the flake-like silver powder based on 100 parts by mass of the electrically conductive paste, a median diameter D50 and a shape of the silver powder having a median diameter D50 of 25 µm or more, the content of the silver powder having a median diameter D50 of 25 µm or more based on 100 parts by mass of the electrically conductive paste, the type of the solvent, and the content of the solvent based on 100 parts by mass of the electrically conductive paste, those shown in the first embodiment can be used.

The silver powder having a bimodal particle size distribution has peaks at 0.1 µm to 0.5 µm and 1 µm to 15 µm, and preferably has peaks at 0.1 µm to 0.3 µm and 3 µm to 10 µm.

In the present invention, the bimodal particle size distribution means that measured by a laser diffraction method using SALD-2300 (manufactured by Shimadzu Corporation).

The shape of the silver powder having a bimodal particle size distribution is not particularly limited, and may be either spherical or non-spherical. Examples of the non-spherical shapes include flake-like, needle-like, horn-like, dendritic, granular, irregular-shaped, teardrop-like, plate-like, very thin plate-like, hexagonal plate-like, column-like, rod-like, porous, fibrous, lump-like, sponge-like, angular, and round shapes. Among these shapes, the spherical shape is preferable.

When the shape of the silver powder having a bimodal particle size distribution is spherical, the shape is not limited to a true spherical shape, and may be any shape as long as a majority of particles constituting the silver powder are recognized as spherical under a microscope. Typically, it means that 80% by mass or more of the particles (primary particles) constituting the silver powder have a spherical shape or a shape similar thereto. Here, the spherical particles mean particles having an aspect ratio (ratio of long diameter/short diameter) of 1.0 to 1.3.

The content of the flake-like silver powder is 8 to 55 parts by mass, preferably 15 to 40 parts by mass, and more preferably 20 to 35 parts by mass based on 100 parts by mass in total of the flake-like silver powder, the silver powder having a median diameter D50 of 25 µm or more, and the silver powder having a bimodal particle size distribution.

The content of the silver powder having a median diameter D50 of 25 µm or more is 15 to 65 parts by mass, preferably 20 to 65 parts by mass, and more preferably 30 to 60 parts by mass based on 100 parts by mass in total of the flake-like silver powder, the silver powder having a median diameter D50 of 25 µm or more, and the silver powder having a bimodal particle size distribution.

The content of the silver powder having a bimodal particle size distribution is 4 to 45 parts by mass, preferably 10 to 40 parts by mass, and more preferably 15 to 30 parts by mass based on 100 parts by mass in total of the flake-like silver powder, the silver powder having a median diameter D50 of 25 µm or more, and the silver powder having a bimodal particle size distribution.

If the content of the flake-like silver powder, the content of the silver powder having a median diameter D50 of 25 µm or more, and the content of the silver powder having a bimodal particle size distribution are all within the above numerical ranges, an electrically conductive paste having a low electric resistance value and excellent electrical conductivity when made into a sintered body as well as an excellent bonding strength when electronic substrates and the like are bonded can be obtained.

The content of the silver powder having a bimodal particle size distribution based on 100 parts by mass of the electrically conductive paste is preferably 5 to 40 parts by mass, more preferably 10 to 35 parts by mass, and most preferably 10 to 30 parts by mass.

The electrically conductive paste of the present invention can be prepared by kneading a flake-like silver powder, a silver powder having a median diameter D50 of 25 µm or more, and a solvent, and in some cases a silver powder having a bimodal particle size distribution, using ARV-310 (manufactured by Shinky Co., Ltd.) device.

Third Embodiment

The present invention provides a sintered body obtained by sintering the above electrically conductive paste.

The sintered body can be obtained by printing or applying an electrically conductive paste on a substrate and then sintering it. Since such a sintered body has electrical conductivity, it functions as a wiring (electronic circuit) on the substrate. The method of printing or applying the electrically conductive paste is not particularly limited, and examples thereof include dispensing application, printing application, spray application, brush application, and injection.

The substrate on which the sintered body is provided is not particularly limited, and examples thereof include a glass fiber reinforced epoxy-based printed circuit board such as FR4 having high heat resistance, a polyimide-based substrate, a ceramic substrate such as DBA (Direct Bonded Aluminum) and DBC (Direct Bonded Copper), a metal substrate such as copper, silver, and aluminum, and a Cu lead frame. An electronic component is mounted on the substrate. The metal substrate may be metal-plated. Examples of the metals used for metal plating include gold, silver, nickel and tin.

The conditions for sintering the electrically conductive paste are not particularly limited, but the heating temperature in sintering is preferably 150 to 350° C., more preferably 180 to 300° C., and most preferably 200 to 300° C. The heating time in sintering is preferably 10 to 60 minutes, more preferably 15 to 45 minutes, and most preferably 20 to 30 minutes. No pressure is applied to the electrically conductive paste during sintering. Sintering can be performed in the air atmosphere or the atmosphere having an oxygen concentration of 1% or more.

The shape of the sintered body is not particularly limited, and examples thereof include a sheet shape, a film shape, a tape shape, a linear shape, a disk shape, a block shape, a spot shape, and an irregular shape.

The sintered body of the present invention can achieve an electric resistance value of 8.5 $\mu\Omega$·cm or less. The electric resistance value of the sintered body can be measured by the method described in "(1) Evaluation of electric resistance value" of (Evaluation) described later.

Fourth Embodiment

The present invention provides a sintered body obtained by sintering a laminated body including a substrate, the above electrically conductive paste, and an electrical conductor.

An electrically conductive paste and an electrical conductor may be sequentially laminated on a substrate to manufacture a laminated body. Then, by sintering the laminated body, a sintered body can be obtained. In such a sintered body, the portion derived from the electrically conductive paste functions as an electrically conductive bonding portion (adhesive portion) because it has electrical conductivity and bonds the substrate and the electrical conductor. Examples of the substrate to be bonded include a circuit substrate, a glass fiber reinforced epoxy-based printed circuit board, a polyimide-based substrate, a ceramics substrate, a metal substrate, and a Cu lead frame. In addition, examples of the electrical conductor to be bonded include a chip part such as a capacitor and a resistor, and a chip formed by forming a semiconductor element such as a resistor, a transistor, a capacitor, and an integrated circuit on a wafer and then cutting out the section of each semiconductor element from the wafer.

The conditions for sintering the above laminated body vary depending on the object to be bonded, and for example, when sintering a 4 mm×4 mm silicon chip to an Ag-plated Cu lead frame, the conditions of 250° C. for 30 minutes under the atmospheric pressure in the air atmosphere can be mentioned.

The above laminated body after sintering can achieve a shear strength of 25 MPa or more. In the present invention, the shear strength means that measured by a method according to JIS Z 3198, and the bonding strength (shear strength) of the above laminated body after sintering can be measured by the method described in "(2) Evaluation of shear strength" in (Evaluation) described later.

Hereinafter, the present invention will be specifically described by way of Examples, but the present invention is not limited to the contents described in Examples.

EXAMPLES (Evaluation)
The electric resistance value and the shear strength of each of the electrically conductive pastes of Examples 1 to 11 and Comparative Examples 1 to 13 were evaluated as follows.

(1) Evaluation of Electric Resistance Value
The electrically conductive paste of each of Examples 1 to 11 and Comparative Examples 1 to 13 was applied to a glass substrate (thickness of 2 mm) by screen printing using a metal mask (thickness of 100 µm). The glass substrate coated with the electrically conductive paste was heated at 200° C. for 30 minutes in air atmosphere and atmospheric pressure for sintering to form a wiring. The wiring of the sintered body of the electrically conductive paste obtained in this manner had dimensions of 3 mm×30 mm in length×width. A schematic diagram of the obtained wiring is shown in FIG. 1.

The thickness of the wiring of the sintered body obtained in this way for each of Examples 1 to 11 and Comparative Examples 1 to 13 was measured using a standard outside micrometer M110 (manufactured by Mitutoyo Corporation) under the conditions of room temperature (25° C.) and relative humidity of 50%. Then, the electric resistance value ($\mu\Omega$·cm) of the wiring for each of Examples 1 to 11 and Comparative Examples 1 to 13 was measured by the four-terminal method using lozesta-GP MCP-T610 (manufactured by Mitsubishi Chemical Corporation) under the conditions of room temperature (25° C.) and relative humidity of 50%. An ESP probe (MCP-TP08P, No. 014052B, manufactured by Mitsubishi Chemical Corporation) was used as a four-terminal probe for measuring the electric resistance value. The average value of electric resistance values ($\mu\Omega$·cm) was calculated from three measurements for each wiring.

It can be said that the electrical conductivity is good if the average value of electric resistance values of the wiring is 8.5 $\mu\Omega$·cm or less.

(2) Evaluation of Shear Strength
A copper substrate (length×width dimensions: 50 mm×50 mm) in which a Ti layer (thickness of 40 nm) and an Ag layer (thickness of 1000 nm) in order from the copper substrate side were laminated by sputtering (hereinafter referred to as test piece (1)) was prepared. On the Ag layer of the test piece (1), each of the electrically conductive pastes of Examples 1 to 11 and Comparative Examples 1 to 13 was screen-printed using a metal mask (thickness of 100 µm).

On the other hand, a Si chip (length×width dimensions: 3 mm×3 mm) in which a Ti layer (thickness of 40 nm) and an Ag layer (thickness of 1000 nm) in order from the Si chip side were laminated by sputtering (hereinafter referred to as test piece (2)) was prepared.

Then, for Examples 1 to 3 and 5 to 11, and for Comparative Examples 1 to 3 and 5 to 13, the Ag layer side of the test piece (2) was laminated on the electrically conductive paste applied to the test piece (1) using a chip mounter (product name SMT-64RH, manufactured by Okuhara Electric Co., Ltd.) to obtain a sample containing the test piece (1), the electrically conductive paste, and the test piece (2). The obtained sample was heated at 200° C. for 30 minutes in air atmosphere and atmospheric pressure for sintering. Regarding Example 4 and Comparative Example 4 in which ethanol was used as the solvent, when the chip mounter was used, the solvent volatilized before the test piece (2) was laminated on the electrically conductive paste, thus the test piece (2) could not be bonded, and in addition, when the sintering was carried out in atmospheric pressure, the solvent volatilized quickly, thus the test piece (2) could not be bonded. Therefore, for Example 4 and Comparative Example 4, the test piece (2) was manually and quickly laminated on the electrically conductive paste, and the pressure during sintering was set to 0.4 MPa, and other conditions were set in the same manner as in Examples 1 to 3 and 5 to 11, and Comparative Examples 1 to 3 and 5 to 13, and the samples after sintering were obtained.

Figure 2:
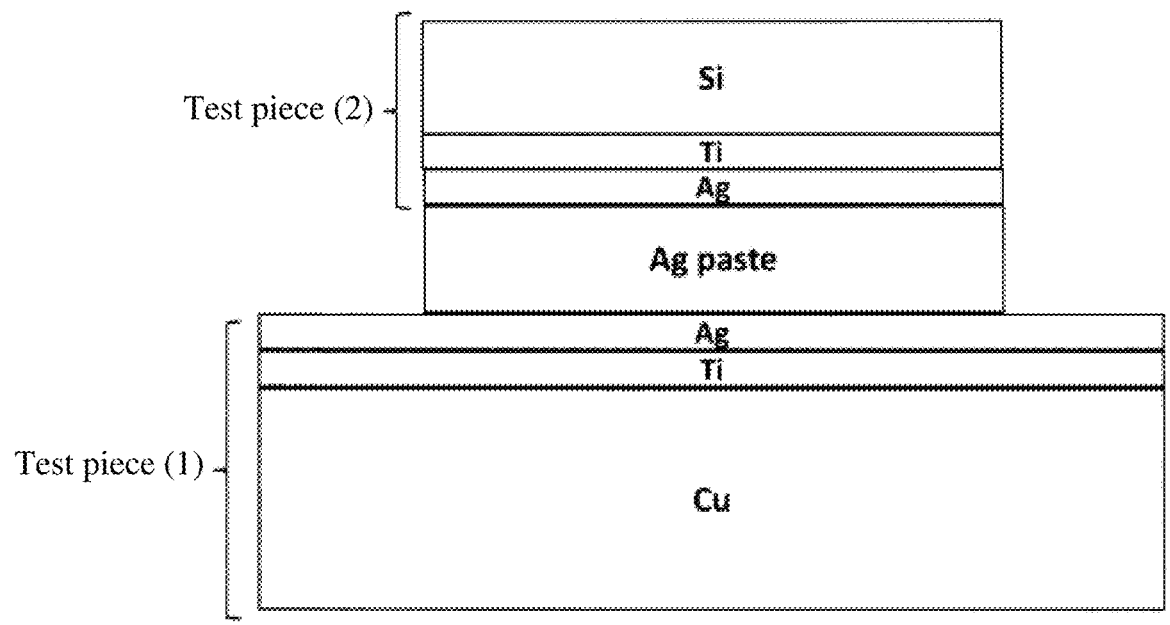
FIG. 2 is a schematic diagram of the sample used for evaluation of the shear strength in Examples.

FIG. 2 shows a schematic diagram of the obtained sample after sintering.

Then, for each of the samples after sintering of Examples 1 to 11 and Comparative Examples 1 to 13, the shear strength (MPa) between the test piece (1) and the test piece (2) was measured under the condition of room temperature (25° C.) in accordance with JIS Z 3198 using a Nordson DAGE Series 4000 universal bond tester (manufactured by Noedon Corporation). Each sample was measured 5 times, and the average value of shear strength (MPa) was calculated.

It can be said that the bondability between the test pieces is good if the average value of shear strength of the samples is 25 MPa or more.

Examples 1 to 11 and Comparative Examples 1 to 13

As the flake-like silver powder, a commercially available product name AgC239 (manufactured by Fukuda Metal Foil & Powder Co., Ltd., median diameter D50: 2.5 μm, flake-like) (hereinafter referred to as "silver powder (1)") was used.

Two types of silver powders having a median diameter D50 of 25 μm or more (hereinafter referred to as "silver powder (2-1)" and "silver powder (2-2)"), a silver powder having a median diameter D50 of less than 25 μm (hereinafter referred to as "silver powder (2-3)"), a silver powder having a particle size distribution of 300 to 700 nm (hereinafter referred to as "silver powder (2-4)"), and a silver powder having a bimodal particle size distribution (hereinafter referred to as "silver powder (3)") were prepared by the following procedure.

Manufacture of Silver Powder (2-1)

Spherical silver powder (silver powder (2-1)) having a median diameter D50 of 36.34 μm was produced by a method of heating silver to a molten state and then spraying and cooling the molten silver (melt spray method).

Manufacture of Silver Powder (2-2)

Spherical silver powder (silver powder (2-2)) having a median diameter D50 of 31.13 μm was produced by a method of heating silver to a molten state and then spraying and cooling the molten silver (melt spray method).

Manufacture of Silver Powder (2-3)

Spherical silver powder (silver powder (2-3)) having a median diameter D50 of 13.67 μm was produced by a method of heating silver to a molten state and then spraying and cooling the molten silver (melt spray method).

Manufacture of Silver Powder (2-4)

A silver powder having a peak at 300 to 700 nm (silver powder (2-4)) was produced by the following manufacturing method.

First, 1.0 g of silver nitrate (silver compound) was dissolved in 50 g of ethylene glycol (polyhydric alcohol). Next, 0.5 g of polyvinylpyrrolidone (dispersing agent) was dispersed in the ethylene glycol. Then, after heating the ethylene glycol to 150° C. (reaction temperature), the reaction was carried out for 1 hour while maintaining the reaction temperature of 150° C. and stirring at a rotation speed of 500 rpm. The silver powder after the reaction was separated from the ethylene glycol (polyhydric alcohol) using a metal mesh, and the separated silver powder was washed with ethanol to obtain silver powder (2-4).

Figure 3A:
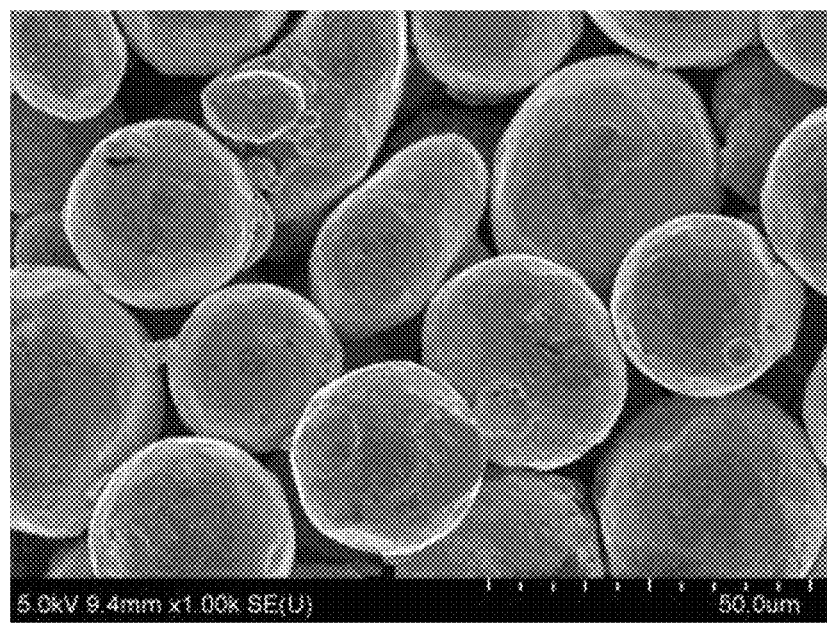
FIG. 3A is an image of the surface of the silver powder (2-1) in Examples taken by a scanning electron microscope (magnification: 1000 times).
Figure 3B:
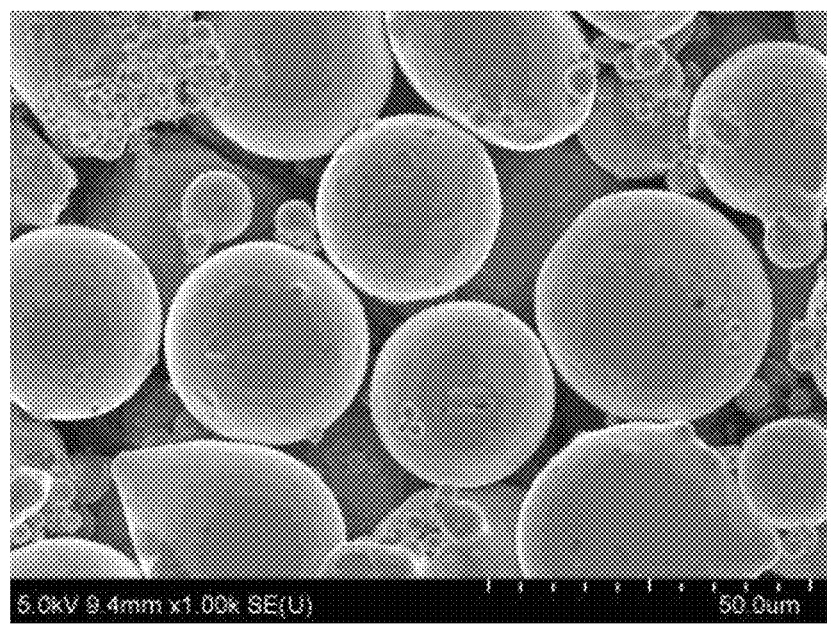
FIG. 3B is an image of the surface of the silver powder (2-2) in Examples taken by a scanning electron microscope (magnification: 1000 times).
Figure 3C:
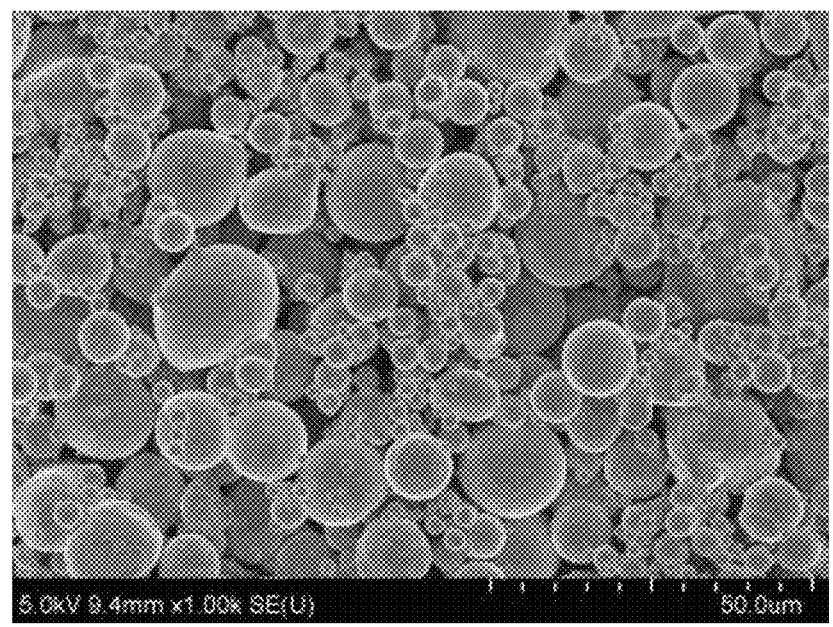
FIG. 3C is an image of the surface of the silver powder (2-3) in Examples taken by a scanning electron microscope (magnification: 1000 times).
Figure 3D:
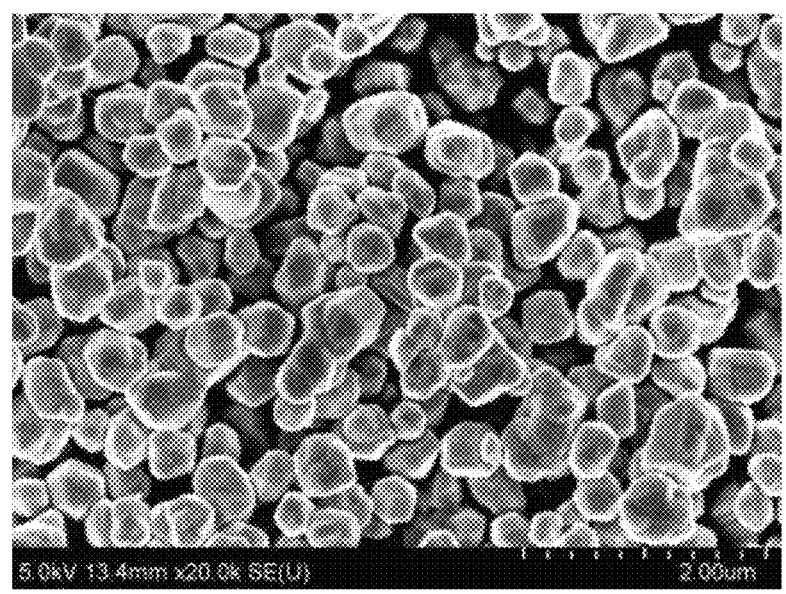
FIG. 3D is an image of the surface of the silver powder (2-4) in Examples taken by a scanning electron microscope (magnification: 20000 times).

FIGS. 3A to 3D show images of the obtained silver powders (2-1) to (2-4) taken by a field emission scanning electron microscope (FE-SEM) (JSM-7000F manufactured by JEOL Ltd.). FIGS. 3A to 3C show the surfaces of silver powders (2-1) to (2-3) taken at magnification of 1000 times, respectively and FIG. 3D shows the surface of silver powder (2-4) taken at magnification of 20000 times.

Hereinafter, the above silver powders (2-1) to (2-4) are collectively referred to as silver powder (2).

Manufacture of Silver Powder (3)

A silver powder (silver powder (3)) having a bimodal particle size distribution with peaks at 0.1 μm to 0.5 μm and 1 μm to 15 μm was produced by the following manufacturing method.

First, silver powder A was produced by exactly the same manufacturing method as silver powder (2-4). Then, while stirring 50 g of ethylene glycol at a rotation speed of 500 rpm, 2.0 g of silver nitrate was dissolved in the ethylene glycol, and then 0.05 g of the silver powder A was further dispersed in the ethylene glycol. Then, after heating the ethylene glycol to 150° C. (reaction temperature), the reaction was carried out for 1 hour while maintaining the reaction temperature of 150° C. and stirring at a rotation speed of 500 rpm. Then, the silver powder after the reaction was separated from the ethylene glycol using a metal mesh, and the separated silver powder was washed with ethanol to obtain silver powder (3).

The median diameter D50 of the silver powders (1) and (2-1) to (2-3) and the particle size distribution of the silver powders (2-4) and (3) used in the Examples and Comparative Examples mean those measured by a laser diffraction method using SALD-2300 (manufactured by Shimadzu Corp.).

Manufacture of Electrically Conductive Paste

The electrically conductive pastes of Examples 1 to 11 and Comparative Examples 1 to 13 were prepared with the compositions shown in Tables 1 and 2 below.

Note that the numerical values of each component in Tables 1 and 2 below represent the parts by mass of each component based on 100 parts by mass of the electrically conductive paste.

Then, with respect to the electrically conductive pastes of Examples 1 to 11 and Comparative Examples 1 to 13, the above electric resistance value and shear strength were evaluated. The evaluation results are shown in Tables 1 and 2 below.

TABLE 1

| | silver powder | | | | solvent | | parts by mass based on 100 parts by mass in total of (1) and (2) | | parts by mass based on 100 parts by mass in total of (1), (2) and (3) | | | thickness of wiring | electric resistance value | shear strength |
|---|---|---|---|---|---|---|---|---|---|---|---|---|---|---|
| | | (2) | | | ethylene | | | | | | | | | |
| | (1) | (2-1) | (2-2) | (3) | glycol | ethanol | (1) | (2) | (1) | (2) | (3) | (μm) | (μΩ·cm) | (MPa) |
| Example 1 | 47.0 | 48.0 | | | 5.0 | | 49.5 | 50.5 | | | | 101 | 5.1 | 31.2 |
| Example 2 | 23.5 | 48.0 | | 23.5 | 5.0 | | 32.9 | 67.1 | 24.7 | 50.5 | 24.7 | 105 | 4.1 | 32.0 |
| Example 3 | 32.0 | 48.0 | | 15.0 | 5.0 | | 40.0 | 60.0 | 33.7 | 50.5 | 15.8 | 103 | 4.9 | 34.1 |

TABLE 1-continued

| | silver powder | | | | solvent | | parts by mass based on 100 parts by mass in total of (1) and (2) | | parts by mass based on 100 parts by mass in total of (1), (2) and (3) | | | thickness of wiring | electric resistance value | shear strength |
|---|---|---|---|---|---|---|---|---|---|---|---|---|---|---|
| | | (2) | | | ethylene | | | | | | | | | |
| | (1) | (2-1) | (2-2) | (3) | glycol | ethanol | (1) | (2) | (1) | (2) | (3) | (μm) | (μΩ·cm) | (MPa) |
| Example 4 | 20.0 | 50.0 | | 20.0 | | 10.0 | 28.6 | 71.4 | 22.2 | 55.6 | 22.2 | 106 | 7.5 | 27.6 |
| Example 5 | 36.0 | 21.0 | | 36.0 | 7.0 | | 63.2 | 36.8 | 38.7 | 22.6 | 38.7 | 103 | 6.5 | 29.5 |
| Example 6 | 12.0 | 48.0 | | 35.0 | 5.0 | | 20.0 | 80.0 | 12.6 | 50.5 | 36.8 | 108 | 6.1 | 29.6 |
| Example 7 | 42.0 | 48.0 | | 5.0 | 5.0 | | 46.7 | 53.3 | 44.2 | 50.5 | 5.3 | 110 | 6.8 | 27.5 |
| Example 8 | 38.0 | 48.0 | | 8.0 | 6.0 | | 44.2 | 55.8 | 40.4 | 51.1 | 8.5 | 106 | 5.2 | 30.8 |
| Example 9 | 36.0 | 22.0 | | 36.0 | 6.0 | | 62.1 | 37.9 | 38.3 | 23.4 | 38.3 | 108 | 6.5 | 29.1 |
| Example 10 | 23.5 | | 48.0 | 23.5 | 5.0 | | 32.9 | 67.1 | 24.7 | 50.5 | 24.7 | 109 | 6.1 | 28.6 |
| Example 11 | 32.0 | | 48.0 | 15.0 | 5.0 | | 40.0 | 60.0 | 33.7 | 50.5 | 15.8 | 100 | 6.0 | 27.3 |

TABLE 2

| | silver powder | | | | | solvent | | parts by mass based on 100 parts by mass in total of (1), and (2) | | parts by mass based on 100 parts by mass in total of (1), (2) and (3) | | | thickness of wiring | electric resistance value | Shear strength |
|---|---|---|---|---|---|---|---|---|---|---|---|---|---|---|---|
| | | (2) | | | | ethylene | | | | | | | | | |
| | (1) | (2-1) | (2-3) | (2-4) | (3) | glycol | ethanol | (1) | (2) | (1) | (2) | (3) | (μm) | (μΩ·cm) | (MPa) |
| Comparative Example 1 | | | | | 94.0 | 6.0 | | | | | | | 95 | 24.0 | 19.8 |
| Comparative Example 2 | 90.0 | | | | | 10.0 | | | | | | | 91 | 11.6 | 18.0 |
| Comparative Example 3 | 62.0 | | | | 31.0 | 7.0 | | | | | | | 94 | 9.1 | 21.3 |
| Comparative Example 4 | 45.0 | | | | 45.0 | | 10.0 | | | | | | 98 | 12.7 | 22.5 |
| Comparative Example 5 | 2.7 | 85.5 | | | 2.7 | 9.1 | | 3.1 | 96.9 | 3.0 | 94.0 | 3.0 | 103 | 368.0 | 3.7 |
| Comparative Example 6 | 41.0 | 10.0 | | | 41.0 | 8.0 | | 80.4 | 19.6 | 44.6 | 10.9 | 44.6 | 96 | 10.3 | 25.1 |
| Comparative Example 7 | | 90.0 | | | | 10.0 | | | | | | | 108 | 560.0 | 0 |
| Comparative Example 8 | 10.0 | 75.0 | | | 10.0 | 5.0 | | 11.8 | 88.2 | 10.5 | 78.9 | 10.5 | 113 | 50.3 | 12.3 |
| Comparative Example 9 | | 52.0 | | | 40.0 | 8.0 | | | | | | | 95 | 357.4 | 0 |
| Comparative Example 10 | 46.0 | | | | 46.0 | 8.0 | | | | | | | 99 | 13.8 | 23.0 |
| Comparative Example 11 | 23.5 | | 48.0 | | 23.5 | 5.0 | | 32.9 | 67.1 | 24.7 | 50.5 | 24.7 | 113 | 7.9 | 21.3 |
| Comparative Example 12 | 32.0 | | 48.0 | | 15.0 | 5.0 | | 40.0 | 60.0 | 33.7 | 50.5 | 15.8 | 107 | 8.1 | 20.9 |
| Comparative Example 13 | 23.5 | | | 48.0 | 23.5 | 5.0 | | 32.9 | 67.1 | 24.7 | 50.5 | 24.7 | 119 | 13.6 | 18.8 |

The electrically conductive pastes of Examples 1 to 11 contain a flake-like silver powder having a median diameter D50 of 15 μm or less, a silver powder having a median diameter D50 of 25 μm or more, and a solvent, and the content of the flake-like silver powder is 15 to 70 parts by mass and the content of the silver powder having a median diameter D50 of 25 μm or more is 30 to 85 parts by mass based on 100 parts by mass in total of the flake-like silver powder and the silver powder having a median diameter D50 of 25 μm or more.

From the results in Table 1 above, in the electrically conductive pastes of Examples 1 to 11, it was found that the wiring of the sintered body had a low electric resistance value and good electrical conductivity, and the sintered body had excellent shear strength and good bondability.

Among them, in Examples 2 and 3 in particular, it was found the wiring of the sintered body had a low electric resistance value and better electrical conductivity, and the sintered body had excellent shear strength and better bondability. In the electrically conductive pastes of Examples 2 and 3, the content of the flake-like silver powder is 30 to 42 parts by mass and the content of the silver powder having a median diameter D50 of 25 μm or more is 58 to 70 parts by mass based on 100 parts by mass in total of the flake-like silver powder and the silver powder having a median diameter D50 of 25 μm or more.

On the other hand, Comparative Example 1 shown in Table 2 above is an electrically conductive paste containing neither silver powder (1) nor silver powder (2). Comparative Examples 2 to 4 and 10 are electrically conductive pastes containing no silver powder (2). In addition, Comparative Examples 7 and 9 are electrically conductive pastes containing no silver powder (1). Although Comparative Examples 5 and 8 are electrically conductive pastes containing both silver powder (1) and silver powder (2-1), the content of silver powder (1) is less than 15 parts by mass and the content of silver powder (2-1) is more than 85 parts by mass based on 100 parts by mass in total of silver powder (1) and silver powder (2-1). Furthermore, although Comparative Example 6 is an electrically conductive paste containing both silver powder (1) and silver powder (2-1), the content of silver powder (1) is more than 70 parts by mass and the content of silver powder (2-1) is less than 30 parts by mass based on 100 parts by mass in total of silver powder (1) and silver powder (2). Comparative Examples 11 to 13 are electrically conductive pastes containing no silver powder having a median diameter D50 of 25 µm or more.

As can be seen from the results in Table 2, in the electrically conductive pastes of Comparative Examples 1 to 5, 7 to 10, and 13, the wiring of the sintered body had a high electric resistance value and insufficient electrical conductivity, and the sintered body had low shear strength and poor bondability, compared with the electrically conductive pastes of Examples 1 to 13. In the electrically conductive paste of Comparative Example 6, although the sintered body had good bondability, the wiring of the sintered body had a high electric resistance value and insufficient electrical conductivity. In addition, in the electrically conductive pastes of Comparative Examples 11 and 12, although the wiring of the sintered body had good electrical conductivity, the sintered body had low shear strength and poor bondability.

FIGS. 4A to 6B show images of the wirings of the sintered bodies in Example 3 and Comparative Examples 3 and 7 taken by a field emission scanning electron microscope (FE-SEM) (JSM-7000F manufactured by JEOL Ltd.).

Figure 4A:
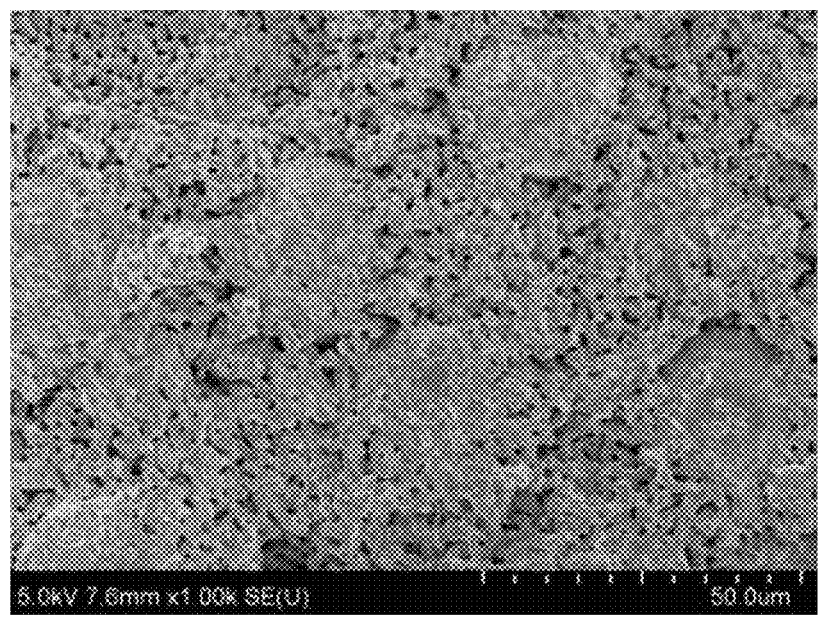
FIG. 4A is an image of the surface of the wiring in the sintered body of Example 3 taken by a scanning electron microscope (magnification: 1000 times).
Figure 4B:
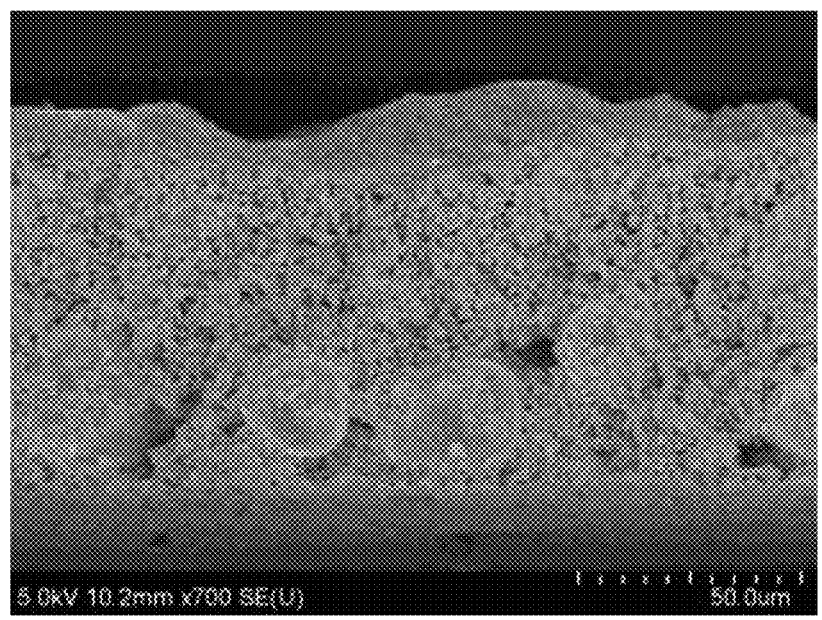
FIG. 4B is an image of the cross section of the wiring in the sintered body of Example 3 taken by a scanning electron microscope (magnification: 700 times).
Figure 4C:
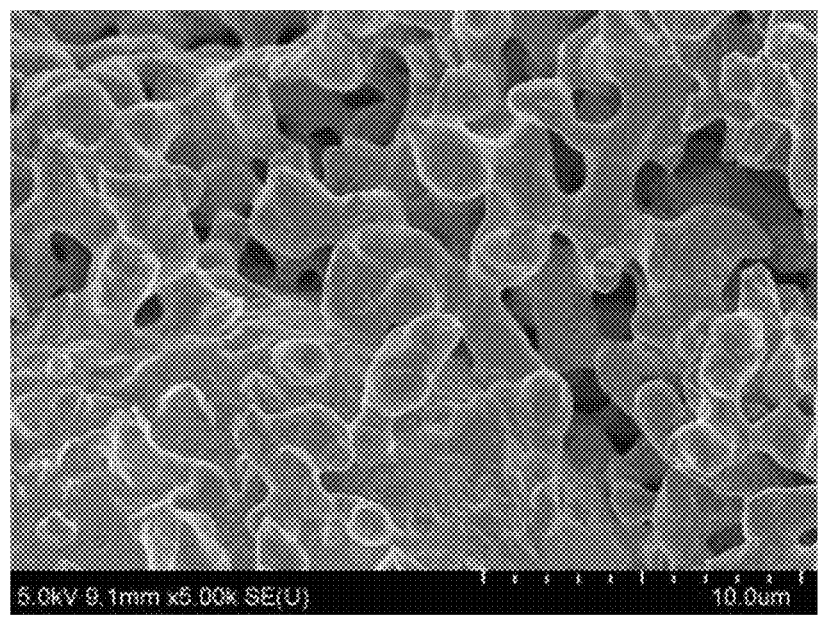
FIG. 4C is an image of the surface of the wiring in the sintered body of Example 3 taken by a scanning electron microscope (magnification: 5000 times).
Figure 4D:
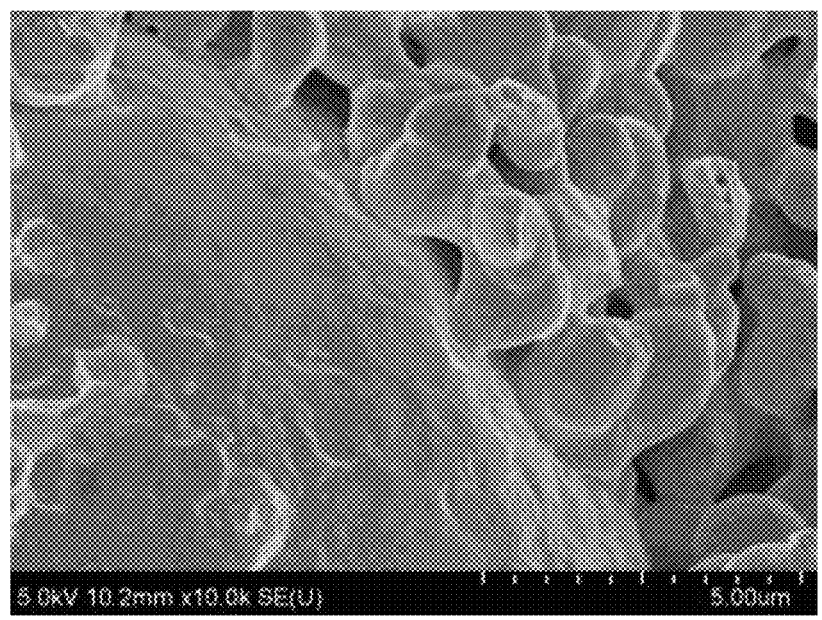
FIG. 4D is an image of the surface of the wiring in the sintered body of Example 3 taken by a scanning electron microscope (magnification: 10000 times).

FIGS. 4A, 4C, and 4D show the surface of the wiring of Example 3 taken at magnifications of 1000, 5000, and 10000 times, respectively. FIG. 4B shows the cross section of the wiring of Example 3 taken at a magnification of 700 times.

Figure 5A:
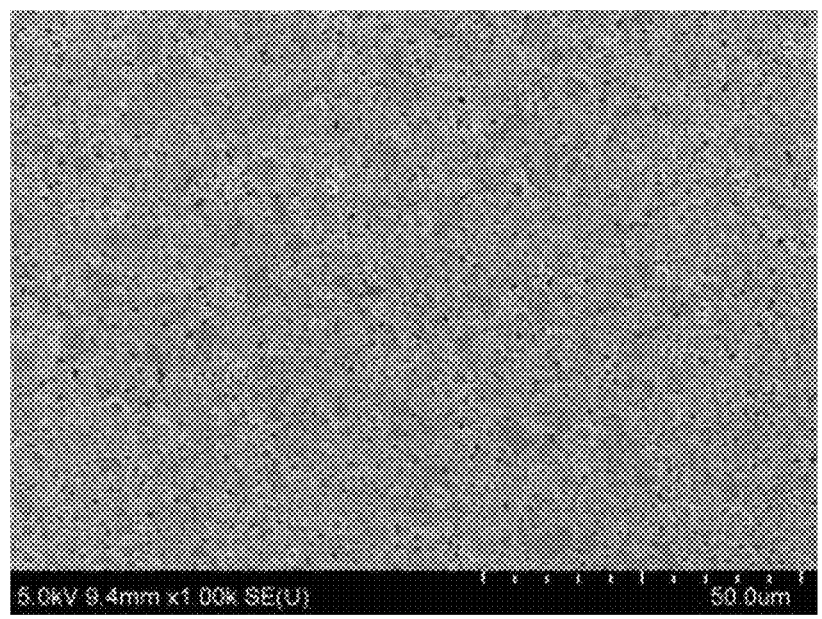
FIG. 5A is an image of the surface of the wiring in the sintered body of Comparative Example 3 taken by a scanning electron microscope (magnification: 1000 times).
Figure 5B:
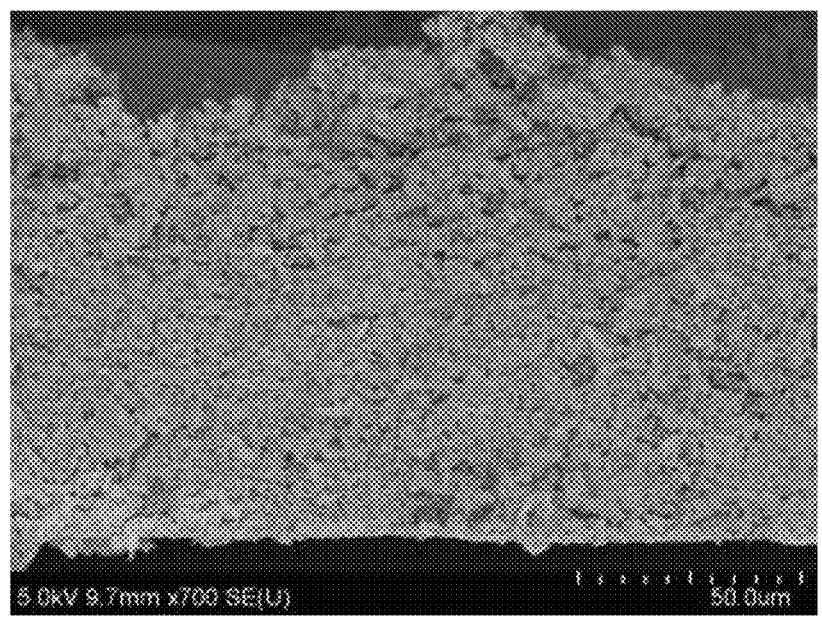
FIG. 5B is an image of the cross section of the wiring in the sintered body of Comparative Example 3 taken by a scanning electron microscope (magnification: 700 times).
Figure 5C:
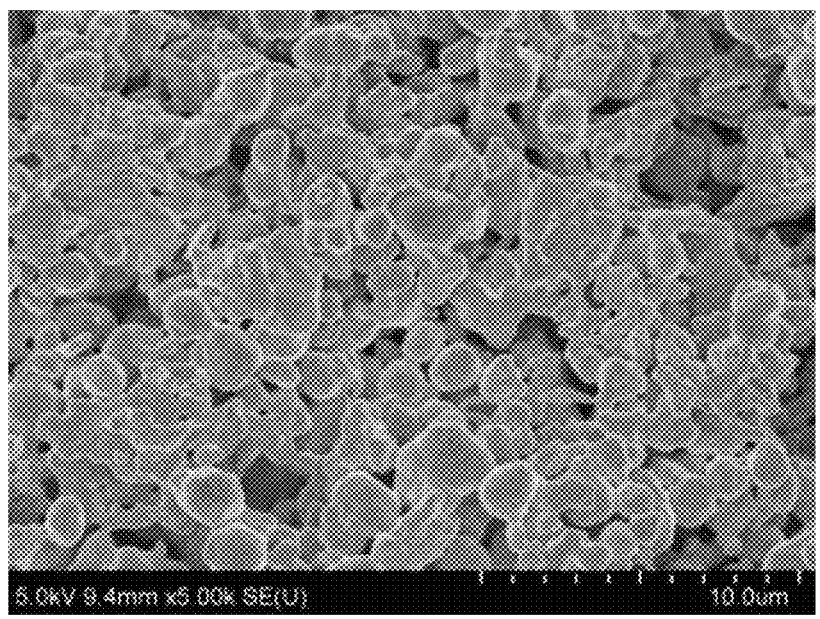
FIG. 5C is an image of the surface of the wiring in the sintered body of Comparative Example 3 taken by a scanning electron microscope (magnification: 5000 times).
Figure 5D:
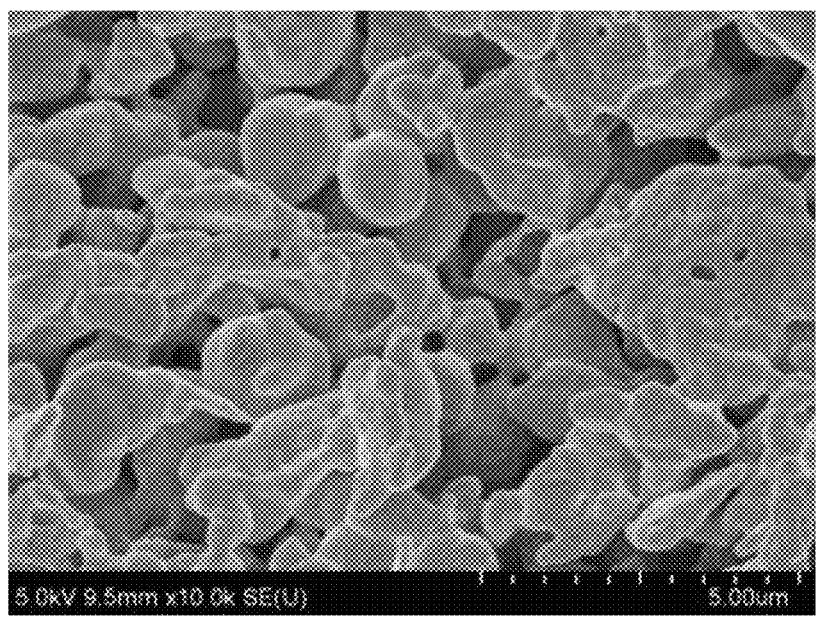
FIG. 5D is an image of the surface of the wiring in the sintered body of Comparative Example 3 taken by a scanning electron microscope (magnification: 10000 times).

FIGS. 5A, 5C, and 5D show the surface of the wiring of Comparative Example 3 taken at magnifications of 1000, 5000, and 10000 times, respectively. FIG. 5B shows the cross section of the wiring of Comparative Example 3 taken at a magnification of 700 times.

Figure 6A:
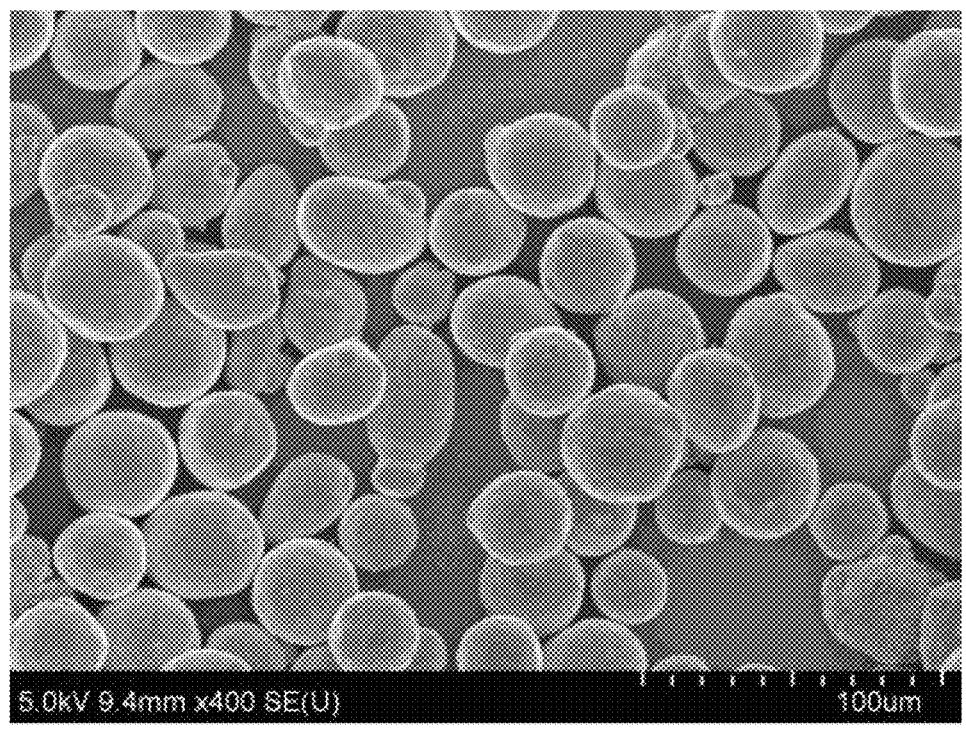
FIG. 6A is an image of the surface of the wiring in the sintered body of Comparative Example 7 taken by a scanning electron microscope (magnification: 400 times).
Figure 6B:
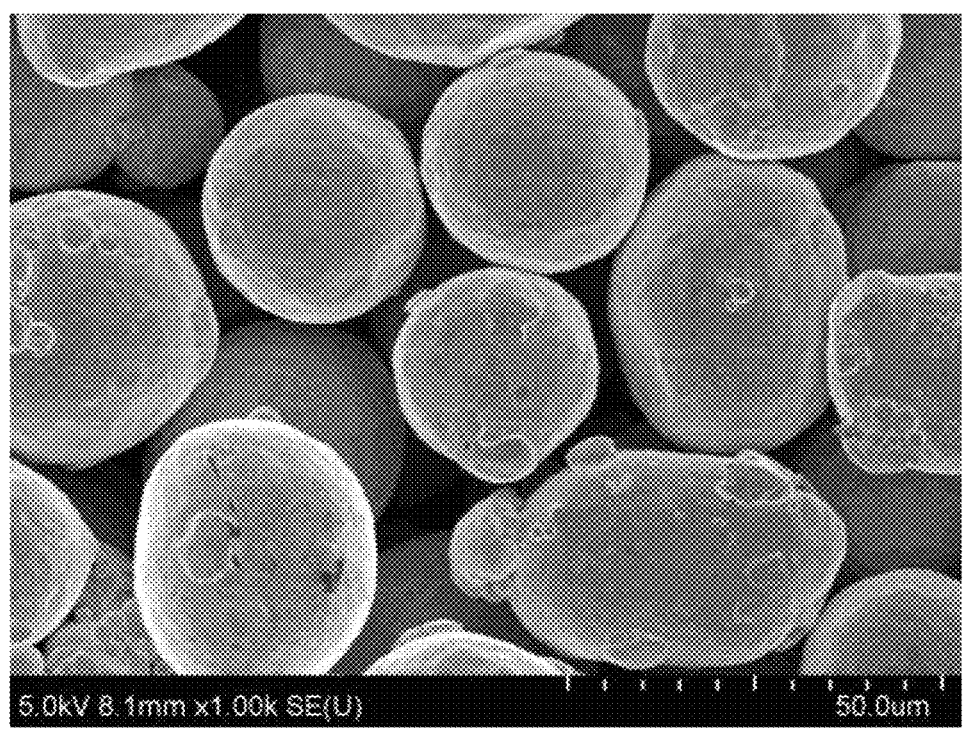
FIG. 6B is an image of the surface of the wiring in the sintered body of Comparative Example 7 taken by a scanning electron microscope (magnification: 1000 times).

FIGS. 6A and 6B show the surface of the wiring of Comparative Example 7 taken at magnifications of 400 and 1000 times, respectively.

From FIGS. 4A to 4D, in the wiring of Example 3, the structures derived from the flake-like silver powder (1) having a small diameter, the silver powder (2-1) having a large diameter, and the silver powder (3) having a small diameter and a bimodal particle size distribution, respectively, were observed in the sintered body. In the wiring of Example 3, it was found that the flake-like silver particles and the silver particles having a small diameter, and the silver particles having a large diameter were sufficiently in contact with each other and were fused. As a result, it is considered that in the wiring of Example 3, the transfer rate of electrons in the wiring increased and the electric resistance value decreased.

On the other hand, from FIGS. 5A to 5D, in the wiring of Comparative Example 3, the structures derived from the flake-like silver powder (1) having a small diameter and the silver powder (3) having a small diameter and a bimodal particle size distribution, respectively, were observed in the sintered body. However, it was found that the wiring of Comparative Example 3 was composed only of the silver powders (1) and (3) having a small diameter and did not contain the silver powder (2-1) or (2-2) having a large diameter, thus the silver particles were in contact with each other in some parts though, in other parts, the silver particles were not in sufficient contact with each other and were not sufficiently fused. As a result, it is considered that the wiring of Comparative Example 3 had a higher electric resistance value than the wiring of Example 3.

From FIGS. 6A and 6B, it was found that the wiring of Comparative Example 7 was composed only of the silver powder (2-1) having a large diameter and did not contain the silver powders (1) and (3) having a small diameter, thus each silver particle existed independently and the silver particles were hardly fused with each other. From this, it is considered that the electric resistance value of the wiring of Comparative Example 7 was extremely high.

FIGS. 7A to 8B show images taken by a field emission scanning electron microscope (FE-SEM) (JSM-7000F manufactured by JEOL Ltd.) of the samples for measuring shear strength after sintering in Example 3 and Comparative Example 3.

Figure 7A:
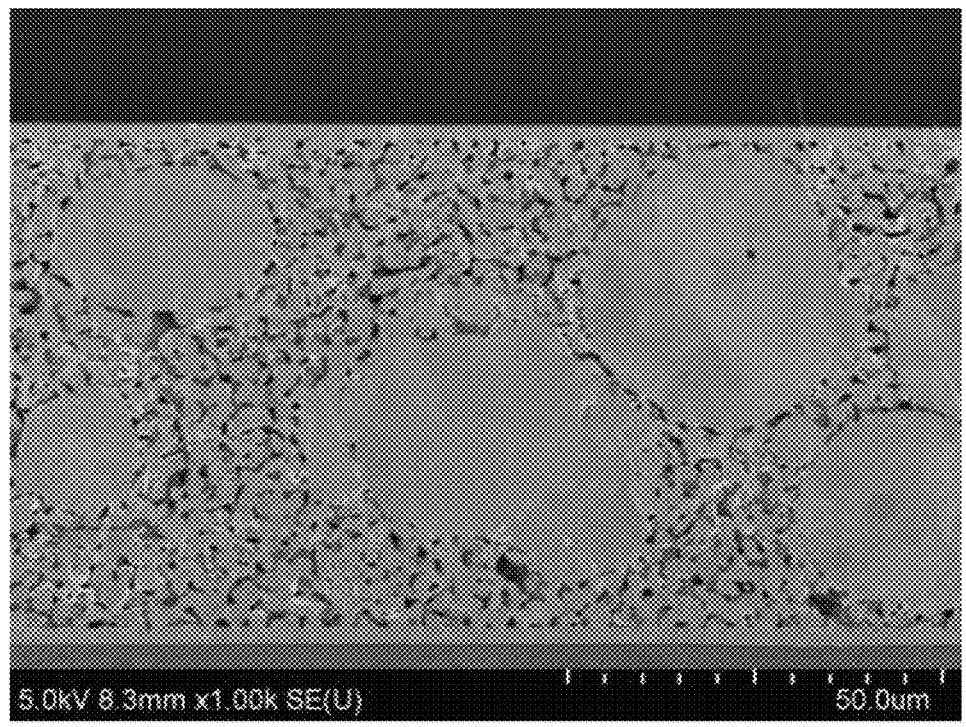
FIG. 7A is an image of the cross section of the sample for shear strength measurement after sintering in Example 3 taken by a scanning electron microscope (magnification: 1000 times).
Figure 7B:
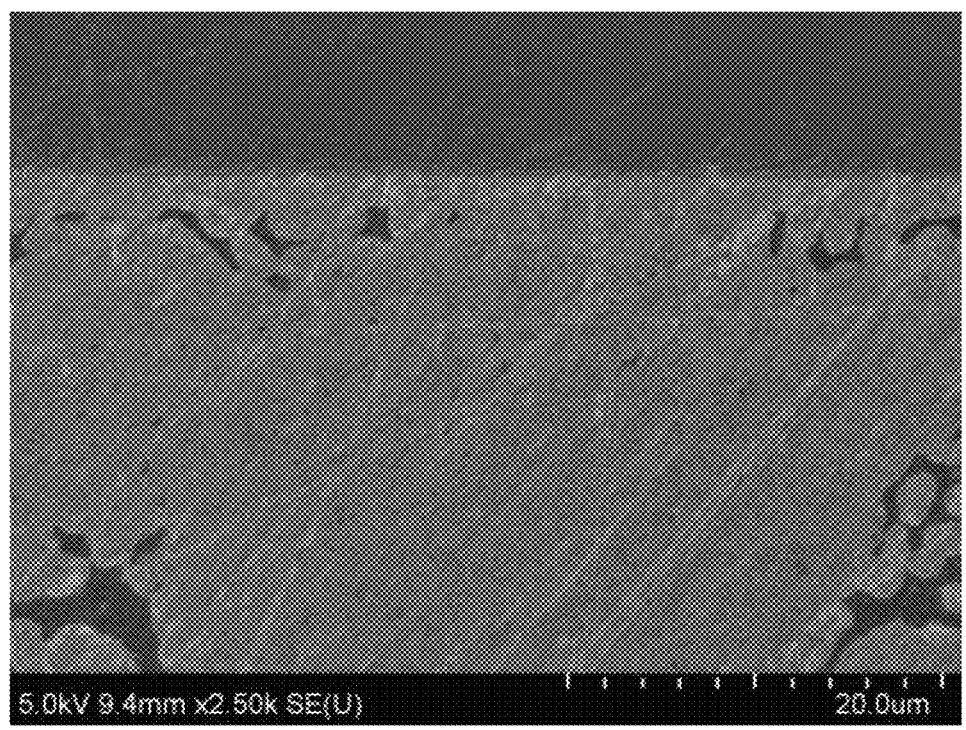
FIG. 7B is an image of the cross section of the sample for shear strength measurement after sintering in Example 3 taken by a scanning electron microscope (magnification: 2500 times).
Figure 8A:
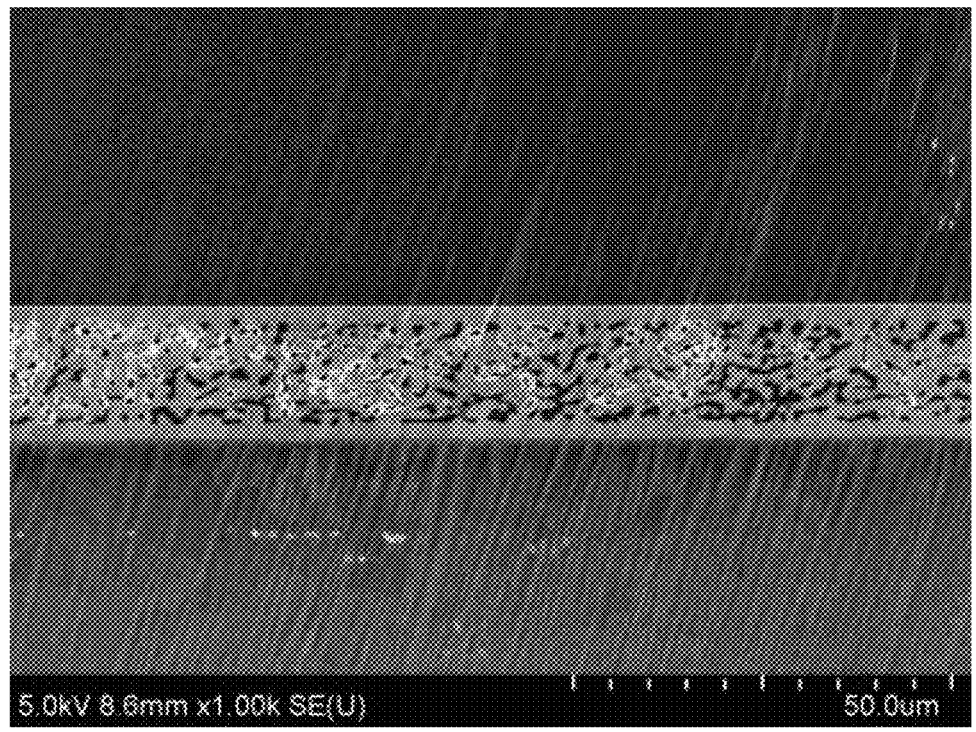
FIG. 8A is an image of the cross section of the sample for shear strength measurement after sintering in Comparative Example 3 taken by a scanning electron microscope (magnification: 1000 times).
Figure 8B:
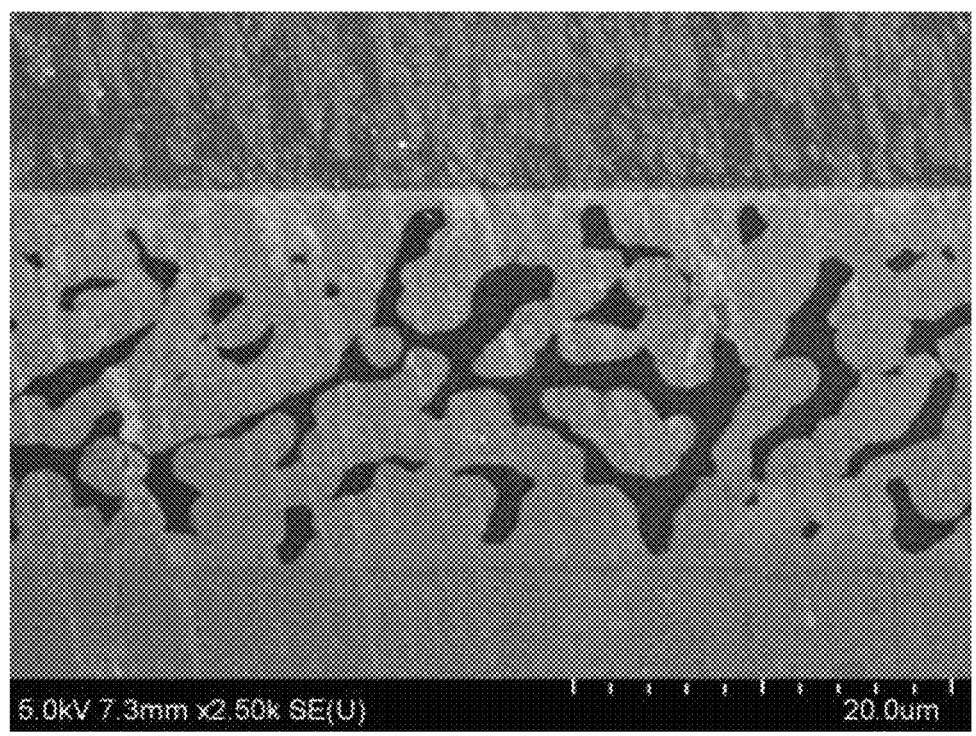
FIG. 8B is an image of the cross section of the sample for shear strength measurement after sintering in Comparative Example 3 taken by a scanning electron microscope (magnification: 2500 times).

FIGS. 7A and 7B show the cross-section of the sample of Example 3 taken at magnifications of 1000 and 2500 times, respectively. FIGS. 8A and 8B show the cross-section of the sample of Comparative Example 3 taken at magnifications of 1000 and 2500 times, respectively.

From FIGS. 7A and 7B, in the sample of Example 3, the structures derived from the flake-like silver powder (1) having a small diameter, the silver powder (2-1) having a large diameter, and the silver powder (3) having a small diameter and a bimodal particle size distribution, respectively, were observed in the sintered body. In the sample of Example 3, it was found that the flake-like silver particles and the silver particles having a small diameter, and the silver particles having a large diameter were in sufficient contact and fusion with each other, and there were few voids inside the sintered body. From this, it is considered that in the sample of Example 3, the sintered body was in close contact with the test piece and showed good shear strength.

On the other hand, from FIGS. 8A and 8B, it was found that the sample of Comparative Example 3 was composed only of the silver powders (1) and (3) having a small diameter, and did not contain the silver powder (2-1) or (2-2) having a large diameter, thus the area where the silver particles were in contact with each other was small and the particles were not sufficiently fused, and therefore there were many voids inside the sintered body. From this, it is considered that the shear strength in the sample of Comparative Example 3 was lower than that in the sample of Example 3.

From comparison between FIGS. 7A and 7B and FIGS. 8A and 8B, it was found that in the sample of Comparative Example 3, the thickness of the sintered body part was smaller than that in the sample of Example 3. The reason for this is that when the test piece (2) was placed on the electrically conductive paste using the tip mounter, it is considered that the electrically conductive paste of Comparative Example 3, which did not contain silver powder (2-1) or (2-2) having a large diameter, was crushed due to the nozzle load of the chip mounter and the thickness was reduced. In addition, Comparative Example 3 did not contain the silver powder (2-1) or (2-2) having a large diameter and contained a larger amount of the solvent, and therefore it is considered that the solvent evaporated during sintering and the sintered body contracted.

As described above, from the results of Tables 1 and 2, it was found that the use of the electrically conductive paste containing a flake-like silver powder having a median diameter D50 of 15 µm or less, a silver powder having a median diameter D50 of 25 µm or more, and a solvent, wherein the content of the flake-like silver powder is 15 to 70 parts by mass and the content of the silver powder having a median diameter D50 of 25 µm or more is 30 to 85 parts by mass based on 100 parts by mass in total of the flake-like silver powder and the silver powder having a median diameter D50 of 25 μm or more, results in excellent electrical conductivity and exhibiting good bondability when it is made into a sintered body.

The invention claimed is:

1. An electrically conductive paste consisting of:
   a silver powder flake having a median diameter D50 of 15 μm or less;
   a silver powder having a median diameter D50 of 25 μm or more; and
   a solvent,
   wherein the content of the silver powder flake is 15 parts by mass to 70 parts by mass, and the content of the silver powder having a median diameter D50 of 25 μm or more is 30 parts by mass to 85 parts by mass, each based on 100 parts by mass in total of the silver powder flake and the silver powder having a median diameter D50 of 25 μm or more, and
   wherein the solvent is water, an alcohol, a glycol ether, a terpineol, or a combination thereof.

2. The electrically conductive paste according to claim 1, wherein the content of the silver powder flake is 30 parts by mass to 42 parts by mass, and the content of the silver powder having a median diameter D50 of 25 μm or more is 58 parts by mass to 70 parts by mass, each based on 100 parts by mass in total of the silver powder flake and the silver powder having a median diameter D50 of 25 μm or more.

3. The electrically conductive paste according to claim 1, wherein the silver powder flake having a median diameter D50 of 15 μm or less comprises primary particles having an aspect ratio of 5 to 300.

4. The electrically conductive paste according to claim 1, wherein the silver powder having a median diameter D50 of 25 μm or more comprises primary particles having a spherical shape or a column shape.

5. An electrically conductive paste consisting of:
   a silver powder flake having a median diameter D50 of 15 μm or less;
   a silver powder having a median diameter D50 of 25 μm or more;
   a silver powder having a bimodal particle size distribution with peaks at 0.1 μm to 0.5 μm and 1 μm to 15 μm; and
   a solvent,
   wherein the content of the silver powder flake is 8 parts by mass to 55 parts by mass, the content of the silver powder having a median diameter D50 of 25 μm or more is 15 parts by mass to 65 parts by mass, and the content of the silver powder having a bimodal particle size distribution is 4 parts by mass to 45 parts by mass, each based on 100 parts by mass in total of the silver powder flake, the silver powder having a median diameter D50 of 25 μm or more, and the silver powder having a bimodal particle size distribution.

6. The electrically conductive paste according to claim 5, wherein the content of the silver powder flake is 23 parts by mass to 35 parts by mass, the content of the silver powder having a median diameter D50 of 25 μm or more is 40 parts by mass to 63 parts by mass, and the content of the silver powder having a bimodal particle size distribution is 12 parts by mass to 35 parts by mass, each based on 100 parts by mass in total of the silver powder flake, the silver powder having a median diameter D50 of 25 μm or more, and the silver powder having a bimodal particle size distribution.

7. The electrically conductive paste according to claim 5, wherein the silver powder having a median diameter D50 of 25 μm or more comprises primary particles having a spherical shape or a column shape, and wherein the silver powder having a bimodal particle size distribution comprises primary particles having a spherical shape.

8. A sintered body obtained by sintering the electrically conductive paste according to claim 1.

9. The sintered body according to claim 8, wherein the sintered body exhibits an electric resistance of 8.5 μΩ·cm or less.

10. The sintered body according to claim 8, wherein the sintered body exhibits a shear strength of 25 MPa or more.

11. A sintered body obtained by sintering a laminated body comprising:
    a substrate,
    the electrically conductive paste according to claim 1, and
    an electrical conductor.

12. A sintered body obtained by sintering the electrically conductive paste according to claim 5.

13. The sintered body according to claim 12, wherein the sintered body exhibits a shear strength of 25 MPa or more.

14. The sintered body according to claim 12, wherein the sintered body exhibits an electric resistance of 8.5 μΩ·cm or less.

15. The electrically conductive paste according to claim 14, wherein the silver powder having a bimodal particle size distribution comprises primary particles having an aspect ratio of 1.0 to 1.3.

16. A sintered body obtained by sintering the electrically conductive paste according to claim 2.

17. A sintered body obtained by sintering the electrically conductive paste according to claim 6.

18. A sintered body obtained by sintering a laminated body comprising:
    a substrate,
    the electrically conductive paste according to claim 5, and
    an electrical conductor.

19. A sintered body obtained by sintering a laminated body comprising:
    a substrate, the electrically conductive paste according to claim 2, and
    an electrical conductor.

20. A sintered body obtained by sintering a laminated body comprising:
    a substrate,
    the electrically conductive paste according to claim 6, and
    an electrical conductor.

* * * * *